(12) United States Patent
Vellianitis

(10) Patent No.: US 9,087,785 B2
(45) Date of Patent: Jul. 21, 2015

(54) METHOD FOR FABRICATING OXIDES/SEMICONDUCTOR INTERFACES

(75) Inventor: Georgios Vellianitis, Heverlee (BE)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/283,785

(22) Filed: Oct. 28, 2011

(65) Prior Publication Data

US 2013/0109199 A1    May 2, 2013

(51) Int. Cl.
*H01L 21/31* (2006.01)
*H01L 21/28* (2006.01)
*H01L 21/02* (2006.01)
*C23C 16/02* (2006.01)
*C23C 16/06* (2006.01)
*C23C 16/40* (2006.01)
*C23C 16/455* (2006.01)
*H01L 29/51* (2006.01)
*H01L 29/66* (2006.01)

(52) U.S. Cl.
CPC ...... *H01L 21/28255* (2013.01); *C23C 16/0281* (2013.01); *C23C 16/06* (2013.01); *C23C 16/405* (2013.01); *C23C 16/45525* (2013.01); *H01L 21/0228* (2013.01); *H01L 21/02175* (2013.01); *H01L 21/02304* (2013.01); *H01L 21/28194* (2013.01); *H01L 21/28229* (2013.01); *H01L 21/28264* (2013.01); *H01L 29/513* (2013.01); *H01L 29/517* (2013.01); *H01L 29/66795* (2013.01)

(58) Field of Classification Search
CPC ............... H01L 2924/0002; H01L 2924/00; H01L 29/66545; H01L 29/78; H01L 2924/00014
USPC ........................ 438/785, 778; 257/E21.271
See application file for complete search history.

(56) References Cited

U.S. PATENT DOCUMENTS

| 7,192,892 | B2 | 3/2007 | Ahn | |
|---|---|---|---|---|
| 7,214,993 | B2 | 5/2007 | Yang | |
| 2004/0087136 | A1 | 5/2004 | Wu et al. | |
| 2009/0309187 | A1* | 12/2009 | Choi et al. | 257/532 |
| 2012/0322220 | A1* | 12/2012 | Chen et al. | 438/381 |

FOREIGN PATENT DOCUMENTS

| JP | 2006269621 A | 10/2006 |
|---|---|---|
| KR | 1020020045264 A | 6/2002 |
| KR | 10-2005-0049866 | 5/2005 |
| KR | 10-2005-0107781 | 11/2005 |

OTHER PUBLICATIONS

Korean Application [1020020045264] using the machine's translation.*

(Continued)

*Primary Examiner* — Tony Tran
(74) *Attorney, Agent, or Firm* — Duane Morris LLP

(57) ABSTRACT

By depositing a layer of oxidizing metal on the semiconductor surface first and then depositing a layer of the high-k oxide material over the layer of oxidizing metal by an atomic layer deposition, a high-k metal oxide is formed at the interface between the semiconductor substrate and the high-k oxide and prevents formation of the undesirable low-k semiconductor oxide layer at the semiconductor/high-k oxide interface.

10 Claims, 2 Drawing Sheets

(56) References Cited

OTHER PUBLICATIONS

Chui, C.O. et al., "A Sub-400° C Germanium MOSFET Technology with High-k Dielectric and Metal Gate", Digest International Electron Devices Meeting, 2002, 00(650):437-440.

Office Action issued Apr. 17, 2013, in counterpart Korean Patent Application No. 10-2012-0003913.
Notice of Allowance issued Jan. 8, 2014, in counterpart Korean Patent Application No. 10-2012-0003913.

* cited by examiner

METHOD FOR FABRICATING OXIDES/SEMICONDUCTOR INTERFACES

FIELD

The disclosed subject matter generally relates to semiconductor integrated circuit fabrication technology for metal oxide semiconductor transistors.

BACKGROUND

With the advancement of the semiconductor integrated circuit fabrication technology for metal oxide semiconductor transistors, high dielectric constant ("high-k") oxide materials are replacing $SiO_2$ in many applications. However, unlike $SiO_2$, high-k oxides are deposited rather than grown by thermal oxidation. With conventional high-k oxide deposition methods such as atomic layer deposition ("ALD"), when a high-k oxide material is deposited on a semiconductor substrate surface, the surface of the semiconductor substrate oxidizes as a result of the oxidizing pulses of the ALD process ($O_3$ or $H_2O$). This results in an undesired low-k oxide interfacial layer between the semiconductor substrate and the deposited high-k oxide layer. This low-k interfacial layer limits equivalent oxide thickness ("EOT") scaling, increases interface trap density (Dit) for non-Si substrates such as those made from Ge or III/V semiconductors, and can potentially create integration problems, especially for non-Silicon surfaces.

DETAILED DESCRIPTION

Figure 1:
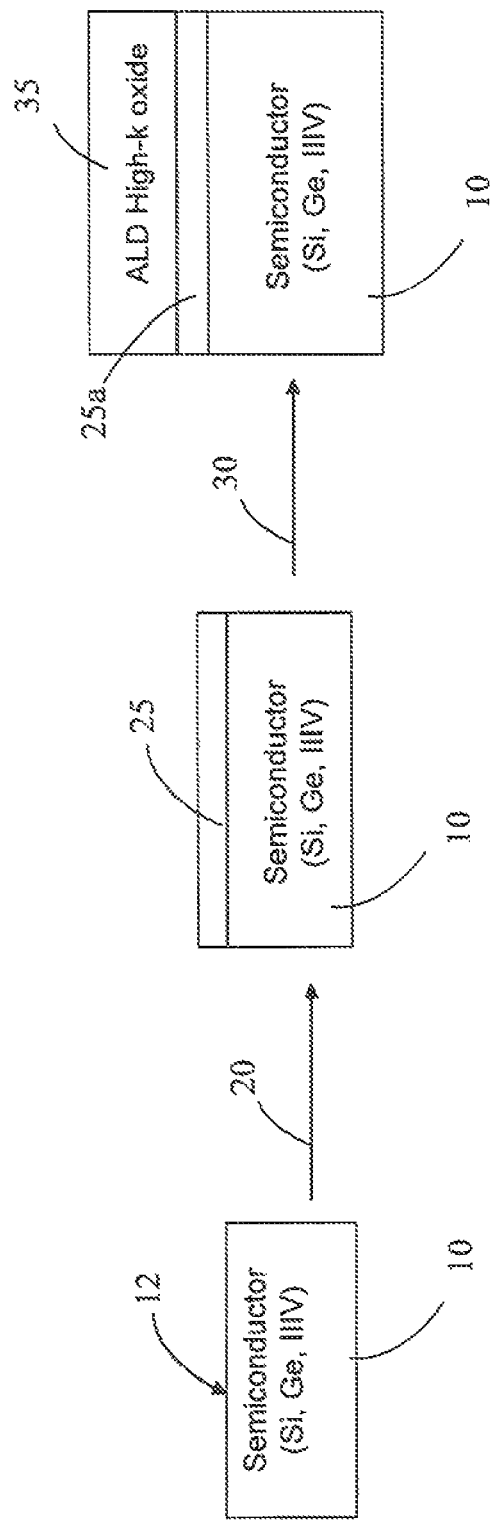
FIG. 1 illustrates the method of fabricating a planar oxide/semiconductor interface according to an embodiment of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "high-k" as used herein refers to a dielectric constant k that is higher than the dielectric constant of silicon dioxide.

Referring to FIG. 1, according to an embodiment, a method of fabricating an oxide/semiconductor interface comprises providing a semiconductor substrate 10 having a surface 12, depositing a layer of oxidizing metal 25 on the semiconductor surface 12, and depositing a layer of high-k oxide material 35 over the layer of oxidizing metal 25 using an atomic layer deposition process 30. During the atomic layer deposition process 30, the oxidizing metal 25 is exposed to the oxidizing agents, ozone ($O_3$) and water ($H_2O$), and forms a high-k metal oxide layer 25a between the semiconductor substrate 10 and the high-k oxide material 35.

The oxidizing metal 25 is one that forms a high-k metal oxide and can be one of aluminum, barium, srontium, scandium, yttrium, lutetium, titanium, zirconium, hafnium, tantalum, molybdenum, lanthanum, cerium, praseodymium, gadolinium, and dysprosium. The dielectric constants for the corresponding oxides for some of these metals are:

| Oxide | dielectric constant, k |
|---|---|
| $Al_2O_3$ | 9 |
| $Ta_2O_5$ | 22 |
| $TiO_2$ | 80 |
| $ZrO_2$ | 25 |
| $HfO_2$ | 25 |
| $La_2O_3$ | 30 |
| $Y_2O_3$ | 15 |

The example structure shown in FIG. 1 is a planar structure. However, the method of the present disclosure can be implemented on a non-planar structure for the semiconductor substrate such as in a non-planar transistor's conducting channel structure seen in finFET structures. The method of the present disclosure also can be implemented on other non-planar transistors, such as, tri-gate transistors and double gate transistors.

Figure 2:
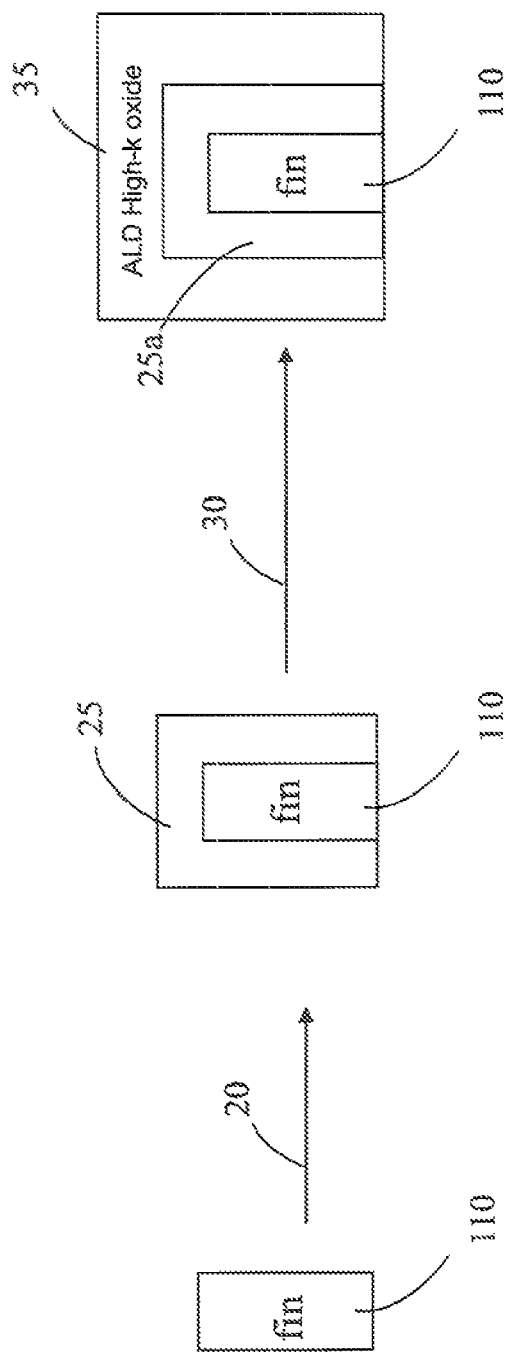
FIG. 2 illustrates another embodiment of the method of fabricating an oxide/semiconductor interface.

FIG. 2 illustrates a finFET example of a non-planar transistor structure. According to this embodiment, a layer of oxidizing metal 25 is deposited on a non-planar semiconductor substrate which is a conducting channel structure, fin 110, of a three dimensional finFET (or multi-gate) structure. The oxidizing metal 25 is deposited using a conformal deposition method so that the oxidizing metal layer 25 covers the fin 110. Next, a layer of high-k oxide material 35 is deposited over the layer of oxidizing metal 25 using an atomic layer deposition process 30. As discussed above, the oxidizing metal 25 is exposed to the oxidizing agents, ozone ($O_3$) and water ($H_2O$), of the atomic layer deposition process 30 and forms a high-k metal oxide layer 25a between the deposited high-k oxide material 35 and the semiconductor fin 110.

The method of the present disclosure eliminates the formation of an undesirable low-k oxide layer between the high-k oxide and the semiconductor. This is particularly beneficial for non silicon-based semiconductors. The method of the present disclosure also results in low Dit and low EOT and thermally stable gate stacks can be achieved The thickness of the oxidizing metal 25 depends on the thickness of the ALD high-k oxide material layer 35 which will be deposited on top. During an ALD oxide deposition, the duration of the $O_3$ or $H_2O$ pulses can be adjusted in order to acquire the deposition process that deposits the desired thickness of the high-k oxide material layer 35 while oxidizing the oxidizing metal layer 25. This pulse duration is directly linked to the thickness of the undesirable low-k interfacial layer that grows during the ALD high-k deposition. Also the total thickness of the ALD high-k oxide material 35 is linked to the thickness of the low-k interfacial layer since thicker ALD high-k oxide means that the semiconductor surface will be exposed to more oxidizing pulses. However, the duration of the oxidizing pulse and the total high-k thickness is not proportional to the thickness of the low-k interfacial layer since as the high-k oxide becomes thicker than the semiconductor surface will be affected less and less. The oxidizing metal 25 should have a thickness approximately equal to the low-k interfacial layer thickness that would grow during a certain ALD high-k oxide deposition process with a specific $H_2O$ or $O_3$ pulse duration.

A full oxidation of the oxidizing metal 25 is desired but not over oxidation or under oxidation. Over oxidation can lead to creation of low-k interfacial layer at the interface between the underlying semiconductor substrate 10, 110 and the metal oxide 25a. Under oxidation can result in some metal material remaining at the interface hindering MOSFET operation.

Oxidation of the oxidizing metal 25 strongly depends on many different parameters. These parameters are: the selection of the oxidizing metal, the ALD high-k process (thickness, duration of oxidizing pulse), and the thickness of the oxidizing metal. In order to avoid over oxidation or under oxidation, for a particular choice of ALD high-k oxide deposition process and oxidizing metal, several thicknesses of the oxidizing metal would need to be tried and checked to determine the optimal thickness for the oxidizing metal. A rule of thumb could be that the thickness of the oxidizing metal is approximately equal to the thickness of the low-k interfacial layer that the ALD high-k oxide deposition process would create on the semiconductor substrate surface in the absence of the oxidizing metal 25.

Although the subject matter has been described in terms of exemplary embodiments, it is not limited thereto. Rather, the appended claims should be construed broadly, to include other variants and embodiments, which may be made by those skilled in the art.

What is claimed is:

1. A method of fabricating oxide/semiconductor interface comprising:
    providing a semiconductor substrate having a surface;
    depositing a layer of metal on the semiconductor surface, wherein the layer of metal is deposited in a non-oxidized state;
    depositing a layer of high-k oxide material on the layer of metal by an atomic layer deposition process, whereby the layer of metal oxidizes from exposure to the atomic layer deposition process' oxidizing agents $O_3$ and $H_2O$ during deposition of the high-k material, thus forming a high-k metal oxide layer at an interface between the semiconductor substrate and the layer of high-k oxide material and prevents formation of undesirable low-k oxide interfacial layer; and
    the deposited metal has a thickness that is approximately equal to the thickness of a low-k interfacial layer that would form on the semiconductor substrate surface in the absence of the metal.

2. The method of claim 1, wherein the semiconductor substrate has a planar structure.

3. The method of claim 1, wherein the semiconductor substrate has a non-planar structure.

4. The method of claim 3, wherein the non-planar structure of the semiconductor substrate is a conducting channel structure of a non-planar transistor.

5. The method of claim 1, wherein the metal is a metal that forms a high-k metal oxide.

6. The method of claim 5, wherein the metal is selected from aluminum, barium, strontium, scandium, yttrium, lutetium, titanium, zirconium, hafnium, tantalum, molybdenum, lanthanum, cerium, praseodymium, gadolinium, and dysprosium.

7. A method of fabricating oxide/semiconductor interface comprising:
    providing a non-planar semiconductor substrate structure having a surface;
    depositing a layer of metal on the non-planar semiconductor substrate surface, wherein the layer of metal is deposited in a non-oxidized state;
    depositing a layer of high-k oxide material on the layer of metal by an atomic layer deposition process, whereby the layer of metal oxidizes from exposure to the atomic layer deposition process' oxidizing agents $O_3$ and $H_2O$ during deposition of the high-k material, thus forming a high-k metal oxide layer at an interface between the semiconductor substrate and the layer of high-k oxide material and prevents formation of undesirable low-k oxide interfacial layer, and
    the deposited metal has a thickness that is approximately equal to the thickness of a low-k interfacial layer that would form on the semiconductor substrate surface in the absence of the metal.

8. The method of claim 7, wherein the non-planar structure of the semiconductor substrate is a conducting channel structure of a non-planar transistor.

9. The method of claim 7, wherein the metal is a metal that forms a high-k metal oxide.

10. The method of claim 9, wherein the metal is selected from aluminum, barium, strontium, scandium, yttrium, lutetium, titanium, zirconium, hafnium, tantalum, molybdenum, lanthanum, cerium, praseodymium, gadolinium, and dysprosium.

* * * * *